(12) United States Patent
Feichtinger et al.

(10) Patent No.: US 9,805,846 B2
(45) Date of Patent: Oct. 31, 2017

(54) ELECTRICAL COMPONENT AND METHOD FOR PRODUCING AN ELECTRICAL COMPONENT

(71) Applicant: EPCOS AG, Munich (DE)

(72) Inventors: Thomas Feichtinger, Graz (AT); Jörg Lauenstein, Deutschlandsberg (AT)

(73) Assignee: EPCOS AG, Munich (DE)

( * ) Notice: Subject to any disclaimer, the term of this patent is extended or adjusted under 35 U.S.C. 154(b) by 241 days.

(21) Appl. No.: 14/365,968

(22) PCT Filed: Oct. 2, 2012

(86) PCT No.: PCT/EP2012/069431
§ 371 (c)(1),
(2) Date: Jun. 16, 2014

(87) PCT Pub. No.: WO2013/087243
PCT Pub. Date: Jun. 20, 2013

(65) Prior Publication Data
US 2014/0319974 A1    Oct. 30, 2014

(30) Foreign Application Priority Data

Dec. 16, 2011    (DE) .................. 10 2011 056 515

(51) Int. Cl.
| H01G 4/232 | (2006.01) |
| H01C 7/00 | (2006.01) |
| H01G 4/30 | (2006.01) |
| H01C 1/142 | (2006.01) |
| H01C 7/18 | (2006.01) |
| H01F 27/06 | (2006.01) |

(Continued)

(52) U.S. Cl.
CPC ............. *H01C 7/008* (2013.01); *H01C 1/142* (2013.01); *H01C 7/18* (2013.01); *H01F 27/06* (2013.01); *H01G 4/012* (2013.01); *H01G 4/232* (2013.01); *H01G 4/30* (2013.01); *H01L 29/861* (2013.01); *H01L 41/0472* (2013.01); *H01F 2027/065* (2013.01)

(58) Field of Classification Search
CPC .. H01G 4/30; H01G 4/06; H01G 4/12; H01G 4/232; H01G 4/1227; H01G 4/248
USPC ......... 361/306.1, 306.3, 301.2, 301.4, 321.1, 361/321.2
See application file for complete search history.

(56) References Cited

U.S. PATENT DOCUMENTS

| 7,570,477 B2 | 8/2009 | Kayatani |
| 8,044,760 B2 | 10/2011 | Feichtinger et al. |

(Continued)

FOREIGN PATENT DOCUMENTS

| DE | 3528077 A1 | 2/1987 |
| DE | 102007007113 A1 | 8/2008 |

(Continued)

*Primary Examiner* — Nguyen Ha
(74) *Attorney, Agent, or Firm* — Slater Matsil, LLP

(57) ABSTRACT

An electrical component includes a main body, a metallic contact structure, which is in direct contact with the main body, and an electrically insulating passivation layer provided with an opening. The metallic contact structure is connected to an external contact-making element through the opening. Furthermore, the external contact-making element is covered and enclosed by a flexible metal composite layer. A method for producing an electrical component is also specified.

17 Claims, 3 Drawing Sheets

(51) Int. Cl.
*H01G 4/012* (2006.01)
*H01L 29/861* (2006.01)
*H01L 41/047* (2006.01)

(56) References Cited

U.S. PATENT DOCUMENTS

| | | | |
|---|---|---|---|
| 8,125,762 B2* | 2/2012 | Bultitude | H01G 2/20 29/25.42 |
| 8,477,476 B2 | 7/2013 | Ishida et al. | |
| 8,730,645 B2* | 5/2014 | Feichtinger | H01G 4/30 361/301.4 |
| 2003/0049884 A1 | 3/2003 | Lutz | |
| 2007/0205514 A1* | 9/2007 | Togashi | H01G 4/2325 257/758 |
| 2009/0002920 A1* | 1/2009 | Itamura | H01G 4/2325 361/321.3 |
| 2010/0067170 A1* | 3/2010 | Koga | H01G 4/228 361/306.3 |
| 2010/0302704 A1* | 12/2010 | Ogawa | H01G 4/30 361/306.3 |

FOREIGN PATENT DOCUMENTS

| | | |
|---|---|---|
| EP | 2034496 A1 | 4/2007 |
| JP | 4257211 A | 9/1992 |
| JP | H09162064 A | 6/1997 |
| JP | 10284343 A | 10/1998 |
| JP | 11162771 A | 6/1999 |
| JP | 2001297944 A | 10/2001 |
| JP | 2009218354 A | 9/2009 |
| JP | 201080703 A | 4/2010 |
| JP | 2011228334 A | 11/2011 |
| JP | 2012169334 A | 9/2012 |
| WO | 2008001542 A1 | 1/2008 |

* cited by examiner

ELECTRICAL COMPONENT AND METHOD FOR PRODUCING AN ELECTRICAL COMPONENT

This patent application is a national phase filing under section 371 of PCT/EP2012/069431, filed Oct. 2, 2012, which claims the priority of German patent application 10 2011 056 515.9, filed Dec. 16, 2011, each of which is incorporated herein by reference in its entirety.

TECHNICAL FIELD

An electrical component is specified. A method for producing an electrical component is furthermore specified.

BACKGROUND

In the case of electrical components embodied as so-called surface-mountable components (SMD component, "surface mounted device"), thermal stresses occur during the surface mounting as a result of the customary reflow soldering at the interface between external termination and main body of the components given different coefficients of thermal expansion of metals and ceramics or metals and semiconductor materials. Said thermal stresses can lead, for example, to nuclei of cracks and as a further consequence to problems regarding the reliability of the electrical components. Particularly electrical components which are enveloped with a glass-containing passivation and comprise a ceramic or silicon body are susceptible to such cracks. Furthermore, the thermal stresses are intensified particularly in the case of electrical components having a relatively large SMD design, for example, a 1210 or larger design.

SUMMARY OF THE INVENTION

At least some embodiments specify an electrical component in which thermal stresses within the component can be reduced. At least some embodiments specify a method for producing an electrical component.

An electrical component in accordance with at least one embodiment comprises a main body. By way of example, the main body can comprise a ceramic material or a semiconductor material. In particular, the main body can be produced by sintering, for example. By way of example, the electrical component can be embodied as a varistor, capacitor, thermistor or TVS silicon diode (TVS: "transient voltage suppressor"). Furthermore, the electrical component comprises a metallic contact structure, which is directly in contact with the main body. That means, in particular, that the metallic contact structure is arranged at least partly in the interior of the main body and/or on a surface of the main body. The metallic contact structure can serve, in particular, to make contact directly with the main body of the electrical component or with at least one or more regions of the main body.

Furthermore, the electrical component comprises an electrically insulating passivation layer. The passivation layer preferably comprises a different material than the main body. The passivation layer can be arranged directly on the main body, in particular on one or more surfaces of the main body, and thus be in direct contact with the main body. Preferably, the passivation layer surrounds or envelopes the main body of the electrical component. The passivation layer can comprise or consist of a glass and/or a ceramic material, for example. The passivation layer can advantageously protect the electrical component against mechanical and/or chemical influences, for example, against corrosion.

In accordance with a further embodiment, the passivation layer is provided with at least one opening. That can mean that the passivation layer has one or more cutouts and that the main body is not covered by the passivation layer in this region or these regions. Preferably, the passivation layer covers the entire surface of the main body apart from the at least one opening.

In accordance with a further embodiment, the metallic contact structure is connected to an external contact-making element through the at least one opening. Preferably, the metallic contact structure is directly connected to the external contact-making element. The external contact-making element is thus arranged at least with one partial region directly on the metallic contact structure. By way of example, the external contact-making element can additionally also be arranged on the passivation layer.

The external contact-making element preferably comprises a metal, for example, silver or copper. Furthermore, the external contact-making element can additionally also comprise glass, for example, in a proportion of 1% to 5%. A good sintering of the external contact-making element with the main body and/or with the passivation layer can be achieved as a result. The external contact-making element can be, for example, a metal pad applied to the main body and/or to the passivation layer or a fired metal paste. Preferably, the external contact-making element has no direct contact with the main body, that is to say that the external contact-making element does not directly touch the main body. An external electrical contact, made with the metallic contact structure can be made by means of the external contact-making element.

In accordance with a further embodiment, the external contact-making element is covered and enclosed by a flexible metal composite layer. The flexible metal composite layer can cover, for example, all those surfaces of the external contact-making element which do not directly touch the metallic contact structure or the passivation layer. In particular, the flexible metal composite layer is embodied in an electrically conductive fashion. The flexible metal composite layer preferably comprises a plastic material, for example, a polymer. The flexible metal composite layer can also comprise an epoxy resin. Furthermore, the flexible metal composite layer preferably comprises a metal, such as copper or silver, for example. By way of example, the plastic material can be permeated by the metal, which can be present in the form of particles, for example. It is also possible for the flexible metal composite layer to be a doped polymer. By means of the flexible metal composite layer, electrical contact can be made with the metallic contact structure externally by means of the external contact-making element.

By means of the design of the electrical component as described here, firstly it is possible to ensure that the metallic contact structure reliably makes through contact with the external contact-making element through the passivation layer. Furthermore, the flexible metal composite layer reduces stresses transmitted from a circuit board or printed circuit board to the electrical component via a solder, as a result of which it is possible to prevent cracks under bending load and thermodynamic cyclic load.

In accordance with a further embodiment, the external contact-making element is at least partly applied on the passivation layer. By way of example, in this case the external contact-making element is in direct contact with partial regions of the passivation layer. Said partial regions preferably adjoin the at least one opening of the passivation layer. For example, the external contact-making element is arranged on the passivation layer in such a way that the at least one opening of the passivation layer on the side facing away from the main body is completely covered by the external contact-making element.

In accordance with a further embodiment, the external contact-making element is arranged in the at least one opening. By way of example, the external contact-making element can be arranged in the cutout that is not covered by the passivation layer, wherein the passivation layer bounds the external contact-making element. In this case, the at least one opening can be completely filled by the external contact-making element.

In accordance with a further embodiment, the flexible metal composite layer is in direct contact with partial regions of the passivation layer. By way of example, the flexible metal composite layer can cover partial regions of the passivation layer. For example, the flexible metal composite layer can at least partly cover a plurality of side surfaces of the electrical component in an edge-encompassing fashion. In particular, it is advantageous if the flexible metal composite layer covers the passivation layer where the electrical component is connected to a carrier or to a further electrical component.

In accordance with a further embodiment, the metallic contact structure projects into the main body. By way of example, the metallic contact structure has at least one internal electrode. It is also possible for the metallic contact structure to have a plurality of internal electrodes. The one or the plurality of internal electrodes serve(s) for making contact with the main body. In the case of a plurality of internal electrodes extending through the passivation layer, the passivation layer preferably has a dedicated opening for each internal electrode. By way of example, the one or the plurality of internal electrodes extend(s) with one end thereof through the one or the plurality of openings of the passivation layer as far as the external contact-making element arranged on the passivation layer and on the opening or openings. As a result, the one or the plurality of internal electrodes is/are in direct contact with the external contact-making element, such that electrical contact can be made with the electrical component externally by means of the flexible metal composite layer, the external contact-making element and the one or the plurality of internal electrodes. The internal electrodes comprise or consist of, for example, a metal, such as silver-palladium, copper or nickel, for example.

In accordance with a further embodiment, the metallic contact structure is embodied as a metallic via. The metallic via is preferably a plated-through hole filled with a metal, for example, with silver. Furthermore, the metallic contact structure can have a plurality of vias extending in each case separately from one another through a dedicated opening of the passivation layer. By way of example, the metallic via extends with one end thereof through the opening of the passivation layer as far as the external contact-making element arranged on the passivation layer and on the opening and is in direct contact with the external contact-making element. As a result, electrical contact can be made with the electrical component externally by means of the metal composite layer, the external contact-making element and the metallic via.

In accordance with a further embodiment, the metallic contact structure is applied on a surface of the main body. By way of example, the metallic contact structure can be embodied as a metallic electrode or as a metal pad, wherein the metallic contact structure is in direct contact with the main body within the at least one opening of the passivation layer. In this case, the external contact-making element can make electrical contact with the main body by means of the metallic contact structure.

In accordance with a further embodiment, a first protective layer is arranged on that side of the flexible metal composite layer which faces away from the main body. Preferably, the first protective layer directly touches the flexible metal composite layer. The first protective layer can be applied in particular directly to all those surface regions of the flexible metal composite layer which are not in contact with the passivation layer and the external contact-making element. By way of example, the first protective layer comprises nickel, copper or silver-palladium or consists of at least one or a combination of said materials. The first protective layer can protect the flexible metal composite layer against chemical and/or mechanical influences and serve in particular as corrosion protection. Furthermore, the first protective layer can have the function of a contact layer by means of which electrical contact is made with the flexible metal composite layer and consequently the electrical component.

In accordance with a further embodiment, a second protective layer is arranged on the first protective layer. Particularly for those embodiments in which the first protective layer comprises nickel or copper, it is preferred for a second protective layer to be arranged on the first protective layer. Preferably, the second protective layer is applied directly to that side of the first protective layer which faces away from the flexible metal composite layer, such that the surface facing away from the flexible metal composite layer is completely covered by the second protective layer. The second protective layer serves as oxidation protection and prevents oxidation of the first protective layer. By way of example, the second protective layer can comprise or consist of tin or gold. Alternatively, the second protective layer can also comprise or consist of an organic material, in particular so-called OSP materials (OSP: "organic surface protection"). For example, the second protective layer can be produced from an organic solution based on imidazoles which is applied to the first protective layer.

The design of an electrical component as described here is distinguished, in particular, by the fact that it satisfies stringent reliability demands, for example, with regard to high bending strength, thermal cycling stability or moisture tests such as are required in the automotive sector, for example.

A method for producing an electrical component is furthermore specified. The electrical component that is producible or produced thereby can comprise one or more features of the embodiments mentioned above. The embodiments described above and below apply equally to the electrical component and to the method for producing the electrical component.

In accordance with one embodiment, a main body is provided, which is provided with a metallic contact structure and an electrically insulating passivation layer. The metallic contact structure can be embodied, for example, as a metal pad, as a metallic via or as one or a plurality of metallic internal electrodes. The electrically insulating passivation layer preferably comprises a glass material or a ceramic material.

Furthermore, an external contact-making element is applied to the main body. The external contact-making element is applied, for example, as metal paste by means of screen printing or alternatively by sputtering or by a dip process. Preferably, after the external contact-making element has been applied, the external contact-making element is in direct contact with the metallic contact structure. Furthermore, a flexible metal composite layer is applied to the external contact-making element and/or regions of the passivation layer, for example, in the form of a polymer paste provided with a metal. The metal composite layer is applied, for example, by means of screen printing or by means of a dip process, such that the external contact-making element is covered and enclosed by the flexible metal composite layer.

In accordance with a further embodiment, a thermal treatment is carried out after applying the external contact-making element and/or after applying the flexible metal composite layer. The thermal treatment following the application of the external contact-making element can be carried out, for example, over a time period of approximately 10 minutes to approximately 60 minutes and at a temperature of approximately 500° C. to approximately 1000° C. The thermal treatment following the application of the flexible metal composite layer is carried out, for example, over a time period of approximately 10 minutes to approximately 120 minutes and at a temperature of approximately 100° C. to approximately 250° C.

In accordance with a further embodiment, a first protective layer is applied to the flexible metal composite layer by means of electroplating or by means of sputtering. The first protective layer serves to protect the flexible metal composite layer against chemical and/or mechanical influences and can comprise or consist of nickel, copper or silver-palladium, for example.

In accordance with a further embodiment, at least one second protective layer is applied to the first protective layer by means of electroplating or sputtering. The second protective layer can comprise or consist of tin, gold or an OSP material, for example, and is intended to protect the first protective layer against oxidation.

The method for producing an electrical component as described here is distinguished, in particular, by the fact that it can be implemented without high additional outlay in comparison with known methods.

BRIEF DESCRIPTION OF THE DRAWINGS

Further advantages and advantageous embodiments of the electrical component will become apparent from the embodiments described below in conjunction with FIGS. 1 to 5.

In the figures.

In the exemplary embodiments and figures, identical or identically acting constituent parts may be provided in each case with the same reference signs. The illustrated elements and their size relationships among one another should not be regarded as true to scale, in principle. Rather, individual elements such as, for example, layers, component parts and regions may be illustrated with exaggerated thickness or size dimensions in order to enable better illustration and/or in order to afford a better understanding.

DETAILED DESCRIPTION OF ILLUSTRATIVE EMBODIMENTS

Figure 1:
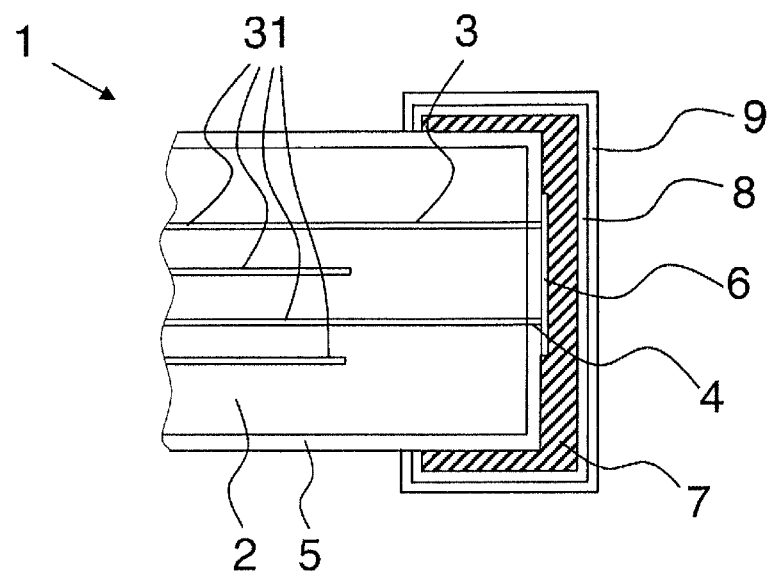
FIG. 1 shows a cut-out view from a cross section of an electrical component in accordance with a first exemplary embodiment, wherein the electrical component is embodied as a ceramic chip.

FIG. 1 shows a cut-out view from a cross section of an electrical component 1 in accordance with a first exemplary embodiment. The electrical component 1, which is embodied as a ceramic chip, for example, in the 2220 design known to the person skilled in the art, comprises a main body 2, which is embodied in a parallelepipedal fashion and comprises a ceramic material. As an alternative thereto, other designs are also possible. In the exemplary embodiment shown, the ceramic material is a varistor ceramic, in particular a ZnO—Bi ceramic. Alternatively, the ceramic material can also be an NTC or PTC ceramic, that is to say a thermistor ceramic, or a dielectric capacitor ceramic, depending on whether the electrical component 1 is embodied as a varistor, as a thermistor or as a capacitor.

The electrical component 1 furthermore comprises a metallic contact structure 3, which comprises a plurality of internal electrodes 31 comprising silver-palladium. Alternatively, the internal electrodes 31 can also comprise or consist of other metals, such as nickel and/or copper, for example. The metallic contact structure 3 is in direct contact with the main body 2, that is to say that the metallic contact structure 3 directly touches the main body 2. By way of example, the electrical component 1 is a ceramic multilayer component in which the internal electrodes 31 are printed onto different ceramic layers and are sintered therewith and are thus in direct contact with the main body 2 formed by the individual ceramic layers.

Furthermore, the electrical component 1 comprises an electrically insulating passivation layer 5 composed of glass. As an alternative to the exemplary embodiment shown, the passivation layer 5 can also comprise or consist of a ceramic material, which is preferably different than the material of the main body. The electrically insulating passivation layer 5 is preferably applied directly to the main body 2. The passivation layer 5 advantageously protects the electrical component 1 against mechanical and/or chemical influences. For the individual internal electrodes 31 extending as far as the passivation layer 5, the passivation layer 5 has in each case an opening 4 through which the internal electrodes 31 project and by means of which the metallic contact structure 3 is thus connected to an external contact-making element 6 (i.e., contact-making means 6). The external contact-making element 6 is produced from a metal paste composed of silver, which is applied, by means of a screen printing method, a dipping method or a sputtering method, to the main body 2 provided with the passivation layer 5. In accordance with a further exemplary embodiment, the metal paste can also comprise other metals, such as copper, for example.

Furthermore, a flexible metal composite layer 7 covers and encloses the external contact-making element 6. The flexible metal composite layer 7 is produced from a silver-polymer paste. Alternatively, the flexible metal composite layer 7 can also comprise or consist of other polymers admixed with one or more metals. By way of example, the metal composite layer 7 can comprise metal particles of different shapes and/or sizes which are distributed in the polymer and by means of which an electrical conduction can take place. What can be achieved by means of the flexible metal composite layer 7 is that crack formations caused by thermodynamic stress, in particular those which occur at the interfaces between main body 2, passivation layer 5 and metal composite layer 7, can be prevented or at least reduced. As a result it is possible that, for example, technical difficulties which occur on account of high temperatures, for example, those greater than 500° C., in the method for producing passivated electrical components, for example, passivated varistors, can be eliminated. Such high temperatures can be required in the production method, for example, for making a through contact of the metallic contact structure to the passivation layer.

A first protective layer 8 composed of nickel is arranged on that side of the flexible metal composite layer 7 which faces away from the main body 2, wherein the first protective layer 8 is applied directly to the flexible metal composite layer 7. Alternatively, the first protective layer 8 can comprise or consist of copper or silver-palladium. The first protective layer 8 protects the flexible metal composite layer 7 against chemical and/or mechanical influences and simultaneously serves as a contact layer by means of which contact is made with the flexible metal composite layer 7.

Furthermore, a second protective layer 9 composed of tin is arranged on the first protective layer 8 and acts as oxidation protection for the first protective layer 8. The second protective layer 9 directly touches the first protective layer 8. Furthermore, it is possible for the second protective layer to comprise or consist of other or further materials suitable for oxidation protection such as, for example, gold or so-called OSP materials (OSP: "organic surface protection"). As an alternative to the exemplary embodiment shown, even further protective layers can also be arranged on the first and/or second protective layer 8, 9.

In so-called EOL bending strength tests (EOL: "end of life"), which are suitable, for example, for determining the average lifetime of an electrical component, it has been found that the electrical component 1 described in connection with FIG. 1 achieves particularly good results in comparison with known components comprising a passivation layer but without the contact-making by means of the metal composite layer as described here.

Figure 2:
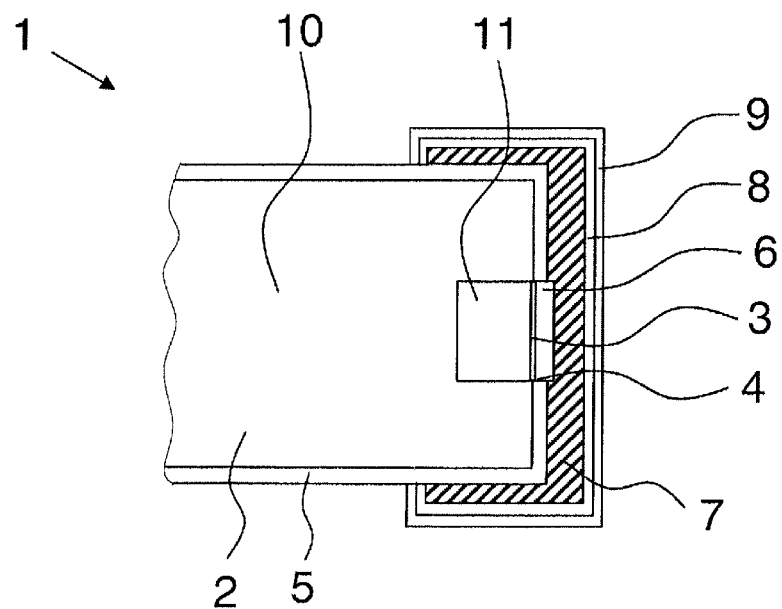
FIG. 2 shows a cut-out view from a cross section of an electrical component in accordance with a second exemplary embodiment, wherein the electrical component is embodied as a silicon TVS diode chip.

FIG. 2 shows a cut-out view from a cross section of an electrical component 1 in accordance with a further exemplary embodiment, wherein the electrical component 1, purely by way of example, is embodied as a silicon TVS diode chip (TVS: "transient voltage suppressor"), and comprises a main body 2, which comprises a semiconductor material and which is covered with an electrically insulating passivation layer 5. The electrically insulating passivation layer 5 has an opening 4. In particular, the electrical component 1 comprises a main body 2 having a p-doped region 10 and an n+-doped region 11, that is to say an indiffused n-type well. The electrical component 1 furthermore comprises a metallic contact structure 3 embodied as a metal pad, for example, as a copper pad or as a copper cathode. The metallic contact structure 3 is applied directly to the main body 2, in particular to the n+-doped region 10, in the opening 4 of the passivation layer 5.

Furthermore, an external contact-making element 6 is arranged on the metallic contact structure 3, such that the external contact-making element 6 is in direct contact with the metallic contact structure 3. In the exemplary embodiment shown, the external contact-making element 6 comprises copper. Alternatively, the external contact-making element 6 can also comprise other electrically conductive materials. The external contact-making element 6 is at least partly arranged in the opening 4 of the passivation layer 5, and the metallic contact structure 3 is connected to the external contact-making element 6 through the opening 4. As a result, electrical contact can be made with the main body 2 via the external contact-making element 6 via the metallic contact structure 3.

A flexible metal composite layer 7 comprising a polymer filled with a metal is arranged on the external contact-making element 6 in such a way that the external contact-making element 6 is covered and enclosed by the flexible metal composite layer 7. Electrical contact can be made with the external contact-making element 6 externally by means of the flexible metal composite layer 7. The flexible metal composite layer 7 makes it possible that crack formations which can occur in particular at connection locations between the passivation layer 5 surrounding the main body 2 and the metal composite layer 7 on account of thermal stresses can be avoided.

Furthermore, a first protective layer 8 composed of nickel is applied on the flexible metal composite layer 7 in regions with do not touch the passivation layer 5 and the external contact-making element 6, said first protective layer protecting the flexible metal composite layer 7 against chemical and/or mechanical influences. Alternatively, the first protective layer 8 can also comprise other or further materials, such as copper or silver-palladium, for example. A second protective layer 9 composed of tin is arranged on the first protective layer 8 and serves as oxidation protection for the first protective layer 8. The second protective layer 9 can likewise comprise other and/or further materials, such as gold or an organic surface protection, for example.

Figure 3:
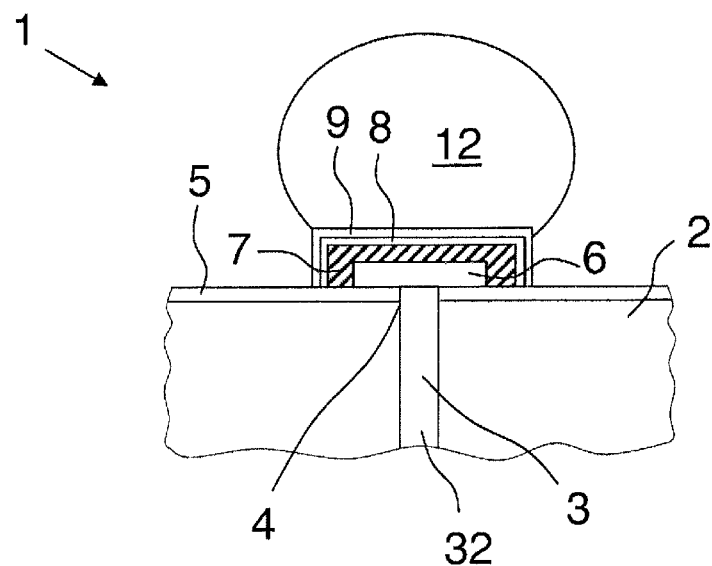
FIG. 3 shows a schematic view of a cut-out view from an electrical component in accordance with a third exemplary embodiment, wherein the electrical component is embodied as a ceramic body with via and ball grid array termination.

FIG. 3 shows a schematic view of a cut-out view from an electrical component 1 in accordance with a further exemplary embodiment, which is embodied as a ceramic body with via. The electrical component 1 comprises a main body 2 composed of aluminum oxide, in which a metallic contact structure 3 is arranged. The metallic contact structure 3 is embodied as a via 32 which is filled with a metal, for example, with silver, and which extends into the main body 2.

Furthermore, the electrical component 1 comprises an electrically insulating passivation layer 5 composed of glass, which is applied directly to the main body 2 and has an opening 4. As an alternative to the exemplary embodiment shown, the electrically insulating passivation layer 5 can also comprise a ceramic material. The via 32 extends with one end thereof through the opening 4 of the passivation layer 5 and is directly connected to an external contact-making element 6, which is embodied as a silver pad and is arranged directly on the passivation layer 5, wherein the external contact-making element 6 covers the opening 4. Consequently, the metallic contact structure 3 is connected to the external contact-making element 6 through the opening 4.

The external contact-making element is covered and enclosed by a flexible metal composite layer 7. In the exemplary embodiment shown, the flexible metal composite layer 7 comprises a polymer admixed with silver. Alternatively, the polymer can also be admixed with other and/or further metals.

A solder ball 12 is arranged on the flexible metal composite layer 7, by means of which solder ball a printed circuit board or other electrical components, such as an LED ("light-emitting diode"), for example, can be linked. In the exemplary embodiment shown, the solder ball 10 comprises a tin-silver-copper solder. Alternatively, other solder materials are also possible.

The electrical component 1 can also comprise further external contact-making element (not shown) which are connected to further metallic vias and are in each case covered by flexible metal composite layers. As a result, a so-called ball grid array (BGA) arises, in which the connections are embodied as solder balls and are situated for an SMD placement on one side of the electrical component. The solder balls are melted by means of reflow soldering in a soldering furnace and combine with contact pads of a carrier, of a printed circuit board or of some other electrical component. Stresses which occur during or after soldering can be effectively compensated for by the metal composite layer 7 on the external contact-making element 6.

Alternatively, it is also possible for the electrical component 1 to comprise, instead of a "ball grid array", as connections to a carrier, a printed circuit board or to some other electrical component, a so-called "land grid array", in which the connections are embodied in the form of a checkered array of contact areas.

Figure 4:
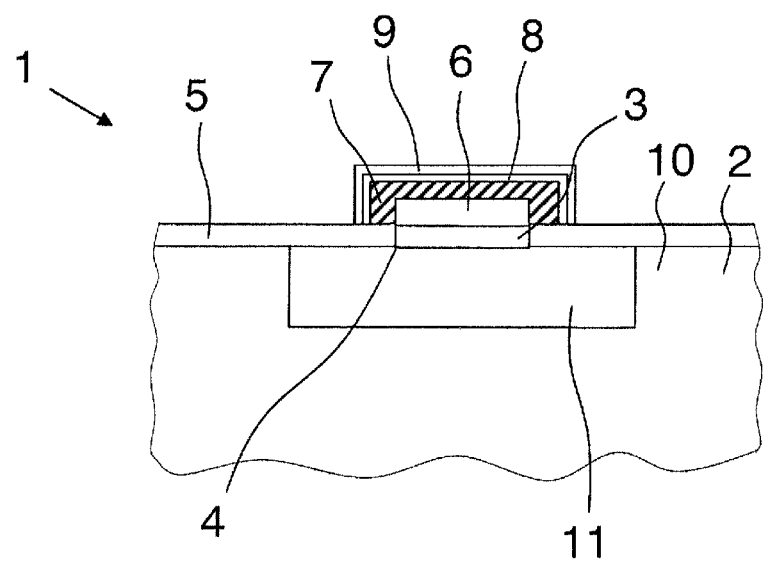
FIG. 4 shows a cut-out view from a cross section of an electrical component in accordance with a fourth exemplary embodiment, wherein the electrical component is embodied as a silicon chip with a land grid array termination.

FIG. 4 illustrates a cut-out view from a cross section of an electrical component 1 in accordance with a further exemplary embodiment, wherein the electrical component 1 is embodied as a semiconductor component. The electrical component 1 comprises a main body 2 composed of silicon. Alternatively, other semiconductor materials are also possible. The main body 2 comprises an n-doped region with an indiffused p-doped well 11. Furthermore, the electrical component 1 comprises an electrically insulating passivation layer 5, which is applied directly to the main body 2 and comprises glass. As an alternative thereto, the passivation layer 5 can also comprise or consist of a ceramic material. The passivation layer 5 has an opening 4. In the region of the opening 4, the main body 2 is not covered by the passivation layer 5.

A metallic contact structure 3 embodied as a copper cathode is arranged in the opening 4 and is in direct contact with the p-type well 11. As an alternative to the exemplary embodiment shown, in which the metallic contact structure 3 is arranged entirely in the opening 4, the metallic contact structure 3 can also partly extend out of the opening and be arranged on a partial region of the passivation layer 5. An external contact-making element 6 embodied as a copper pad is applied on the metallic contact structure 3. The external contact-making element 6 is likewise arranged in the opening 4 of the passivation layer 5.

Furthermore, a flexible metal composite layer 7 is arranged on the external contact-making element 6 and on partial regions of the passivation layer 5, such that the flexible metal composite layer 7 covers and encloses the external contact-making element 6. The flexible metal composite layer 7 comprises a polymer admixed with copper. As an alternative to the exemplary embodiment shown, the polymer can also be admixed with further and/or other metals.

The electrical component 1 can comprise further external contact-making element on metallic contact structures which are in each case enclosed by a flexible metal composite layer. A termination designated as "land grid array" arises as a result. Alternatively, a "ball grid array" termination with solder balls, as shown in the exemplary embodiment of FIG. 3, is also possible.

Figure 5:
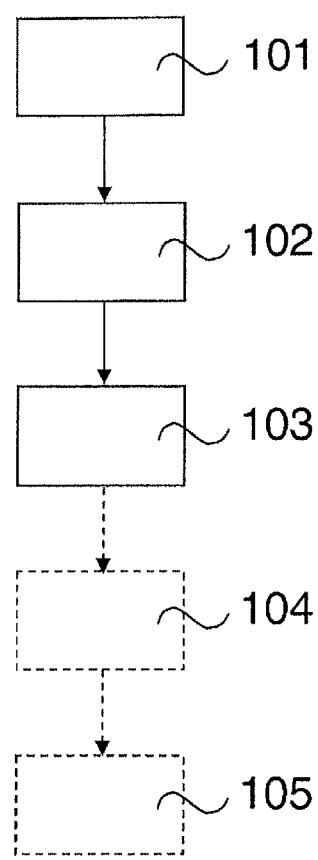
FIG. 5 shows a schematic illustration of methods for producing an electrical component in accordance with further exemplary embodiments.

FIG. 5 shows an illustration of methods for producing an electrical component 1 in accordance with further exemplary embodiments. By way of example, an electrical component 1 in accordance with one of the exemplary embodiments in FIGS. 1 to 4 can be producible by means of the method shown. The following references to features of the electrical component 1 can therefore relate to elements in FIGS. 1 to 4 using the reference signs shown there.

In a first method step 101, a main body 2 is provided. The main body 2 is preferably provided with a metallic contact structure 3, which is directly in contact with the main body 2, and with an electrically insulating passivation layer 5 on its outer surfaces. As already described in connection with FIGS. 1 to 4, the metallic contact structure 3 can be embodied, for example, as a metal pad, as a metallic via 32 or as one or a plurality of metallic internal electrodes 31 and can project through at least one opening 4 of the passivation layer 5 through the latter. The electrically insulating passivation layer 5 preferably comprises a glass material or a ceramic material.

In a second method step 102, an external contact-making element 6 is subsequently applied to the main body 2. The external contact-making element 6 is applied, for example, as metal paste by means of screen printing. Alternatively, the external contact-making element 6 can also be applied to the main body 2 by sputtering or by a dip process. After the external contact-making element 6 has been applied, the external contact-making element 6 is preferably in direct contact with the metallic contact structure 3.

Subsequently, in a third method step 103, a flexible metal composite layer 7 is applied to the external contact-making element 6 and/or to regions of the passivation layer 5, for example, in the form of a polymer paste provided with metal particles, for example, with metal particles of different shapes and sizes. The metal composite layer 7 can be applied by means of screen printing or by means of a dip process, for example. Preferably, after the flexible metal composite layer 7 has been applied, the external contact-making element 6 is covered and enclosed by the metal composite layer 7.

Furthermore, it is possible for a thermal treatment to be carried out between the second method step 102 and the third method step 103 and/or directly after the third method step 103. A thermal treatment carried out between the method steps 102 and 103 can be carried out, for example, over a time period of approximately 10 minutes to approximately 60 minutes and at a temperature of approximately 500° C. to approximately 1000° C. A thermal treatment directly following the method step 103 can be carried out, for example, over a time period of approximately 10 minutes to approximately 120 minutes and at a temperature of approximately 100° C. to approximately 250° C.

In accordance with a further exemplary embodiment, the method step 103 can be followed by a further method step 104, which is indicated by dashed lines in FIG. 5 and in which a first protective layer 8 is applied to the flexible metal composite layer 7. The first protective layer 8 is applied by means of electroplating, for example. Alternatively, the first protective layer 8 can be applied by means of sputtering. The first protective layer 8 can comprise or consist of nickel, copper or silver-palladium, for example. It preferably serves to protect the flexible metal composite layer 7 against chemical and/or mechanical influences.

Furthermore, in accordance with yet another exemplary embodiment, the method step 104 can be followed by a further method step 105, which is likewise indicated by dashed lines and in which a second protective layer 9 is applied to the first protective layer 8, for example, once again by means of electroplating or sputtering. The second protective layer 9 can comprise or consist of tin, gold or an OSP material, for example. The second protective layer 9 preferably protects the first protective layer 8 against oxidation.

The methods for producing an electrical component as described in conjunction with FIG. 5 are distinguished by the fact that they can be implemented without high additional outlay in comparison with known methods.

The invention is not restricted to the exemplary embodiments by the description on the basis of said exemplary embodiments, but rather encompasses any novel feature and also any combination of features. This includes in particular any combination of features in the patent claims, even if this feature or this combination itself is not explicitly specified in the patent claims or exemplary embodiments.

The invention claimed is:

1. An electrical component comprising:
    a main body;
    a metallic contact structure in direct contact with the main body;
    an electrically insulating passivation layer comprising an opening;
    an external contact-making element, wherein the metallic contact structure is connected to the external contact-making element through the opening; and
    a flexible metal composite layer, wherein the external contact-making element is covered and enclosed by the flexible metal composite layer,
    wherein the external contact-making element is partially located in the opening,
    wherein the passivation layer has an inner surface facing the main body and an outer surface facing away from the main body, and
    wherein the external contact-making element extends from the outer surface at least partially in the opening of the passivation layer.

2. The electrical component according to claim 1, wherein the external contact-making element is at least partly arranged on the passivation layer.

3. The electrical component according to claim 1, wherein the flexible metal composite layer is in direct contact with partial regions of the passivation layer.

4. The electrical component according claim 1, wherein the metallic contact structure projects into the main body.

5. The electrical component according to claim 4, wherein the metallic contact structure has at least one internal electrode or is embodied as a metallic via.

6. The electrical component according to claim 1, wherein the metallic contact structure is arranged on a surface of the main body, and wherein the external contact-making element makes electrical contact with the main body through the metallic contact structure.

7. The electrical component according to claim 1, wherein the main body comprises a ceramic material and/or a semiconductor material.

8. The electrical component according to claim 1, wherein the passivation layer comprises glass and/or a ceramic material.

9. The electrical component according to claim 1, wherein the flexible metal composite layer comprises a plastic material.

10. The electrical component according to claim 1, wherein the flexible metal composite layer comprises a polymer.

11. The electrical component according to claim 1, further comprising a first protective layer arranged on that side of the flexible metal composite layer that faces away from the main body.

12. The electrical component according to claim 11, further comprising a second protective layer arranged on the first protective layer.

13. The electrical component according to claim 12, wherein the first protective layer comprises nickel and the second protective layer comprises tin.

14. A method for producing an electrical component, the method comprising:
    forming a metallic contact structure in direct contact with a main body;
    forming an electrically insulating passivation layer comprising an opening;
    forming an external contact-making element, wherein the metallic contact structure is connected to the external contact-making element through the opening; and
    forming a flexible metal composite layer, wherein the external contact-making element is covered and enclosed by the flexible metal composite layer,
    wherein the external contact-making element is partially located in the opening,
    wherein the passivation layer has an inner surface facing the main body and an outer surface facing away from the main body, and
    wherein the external contact-making element extends from the outer surface at least partially in the opening of the passivation layer.

15. A method for producing an electrical component, the method comprising:
    providing a main body, which is provided with a metallic contact structure and an electrically insulating passivation layer;
    applying an external contact-making element to the main body using a screen printing, a sputtering or a dip process, such that the external contact-making element is in electrical contact with the metallic contact structure through an opening in the passivation layer; and
    applying a flexible metal composite layer using a screen printing or a dip process, such that the external contact-making element is covered and enclosed by the flexible metal composite layer,
    wherein the external contact-making element is partially located in the opening,
    wherein the passivation layer has an inner surface facing the main body and an outer surface facing away from the main body, and
    wherein the external contact-making element extends from the outer surface at least partially in the opening of the passivation layer.

16. The method according to claim 15, further comprising carrying out a thermal treatment after applying the external contact-making element.

17. The method according to claim 15, further comprising carrying out a thermal treatment after applying the flexible metal composite layer.

* * * * *